(12) United States Patent
Sung et al.

(10) Patent No.: US 12,557,295 B2
(45) Date of Patent: Feb. 17, 2026

(54) EMBEDDED RERAM WITH BACKSIDE CONTACT

(71) Applicant: International Business Machines Corporation, Armonk, NY (US)

(72) Inventors: Min Gyu Sung, Latham, NY (US); Julien Frougier, Albany, NY (US); Ruilong Xie, Niskayuna, NY (US); Chanro Park, Clifton Park, NY (US); Juntao Li, Cohoes, NY (US); Soon-Cheon Seo, Glenmont, NY (US); Takashi Ando, Eastchester, NY (US); Chen Zhang, Guilderland, NY (US); Heng Wu, Santa Clara, CA (US)

(73) Assignee: International Business Machines Corporation, Armonk, NY (US)

( * ) Notice: Subject to any disclaimer, the term of this patent is extended or adjusted under 35 U.S.C. 154(b) by 543 days.

(21) Appl. No.: 18/065,117

(22) Filed: Dec. 13, 2022

(65) Prior Publication Data

US 2024/0196627 A1 Jun. 13, 2024

(51) Int. Cl.
*H10B 63/00* (2023.01)
(52) U.S. Cl.
CPC .................... *H10B 63/30* (2023.02)
(58) Field of Classification Search
CPC ......................................... H10B 63/30
See application file for complete search history.

(56) References Cited

U.S. PATENT DOCUMENTS

| 8,716,091 B2 | 5/2014 | Cohen et al. |
| 10,163,980 B2 | 12/2018 | Lin et al. |
| 10,439,134 B2 | 10/2019 | Majhi et al. |
| 10,636,739 B2 | 4/2020 | Beyne et al. |
| 10,916,583 B2 | 2/2021 | Wang |
| 11,043,532 B2 | 6/2021 | Yokoyama et al. |
| 11,393,526 B2 | 7/2022 | Pillarisetty et al. |
| 2013/0051115 A1 | 2/2013 | En et al. |
| 2014/0166959 A1 | 6/2014 | Bertin et al. |

(Continued)

FOREIGN PATENT DOCUMENTS

| CN | 120418953 A | 8/2025 |
| DE | 112023004541 T5 | 8/2025 |

(Continued)

OTHER PUBLICATIONS

Prasad, D., et al., "Buried Power Rails and Back-side Power Grids: Arm CPU Power Delivery Network Design Beyond 5nm", 2019 IEEE International Electron Devices Meeting (IEDM), Date of Conference: Dec. 7-11, 2019, 4 pages.

(Continued)

*Primary Examiner* — Patricia D Valenzuela
(74) *Attorney, Agent, or Firm* — Scully, Scott, Murphy & Presser, P.C.; Yuanmin Cai

(57) ABSTRACT

A semiconductor structure including a one-transistor one-capacitor (1T1R) device is provided that includes an embedded resistive random access memory (ReRAM) having a width larger than 1 gate pitch, that is present in a frontside or the backside of the structure, a frontside contact structure electrically connected to a source region of the transistor of the 1T1R device and a backside contact structure electrically connected to a drain region of the transistor of the 1T1R device.

19 Claims, 10 Drawing Sheets

(56) References Cited

U.S. PATENT DOCUMENTS

| | | | |
|---|---|---|---|
| 2014/0346624 A1* | 11/2014 | Shoji | H10N 50/01 |
| | | | 257/421 |
| 2020/0105671 A1 | 4/2020 | Lai et al. | |
| 2021/0134802 A1* | 5/2021 | Gomes | H10B 12/36 |
| 2021/0143211 A1 | 5/2021 | Hiblot et al. | |
| 2021/0296396 A1 | 9/2021 | Wu et al. | |
| 2022/0069076 A1 | 3/2022 | Yu et al. | |
| 2022/0181258 A1 | 6/2022 | Liebmann et al. | |
| 2022/0199468 A1 | 6/2022 | Jun et al. | |
| 2022/0230947 A1 | 7/2022 | Park et al. | |
| 2022/0352256 A1 | 11/2022 | Su et al. | |

FOREIGN PATENT DOCUMENTS

| | | |
|---|---|---|
| WO | 2018004588 A1 | 1/2018 |
| WO | 2024/125228 A1 | 6/2024 |

OTHER PUBLICATIONS

Mathur, R., et al., "Buried Bitline for sub-5nm SRAM Design", 2020 IEEE International Electron Devices Meeting (IEDM), Date of Conference: Dec. 12-18, 2020, 4 pages.

Sung, M. G., et al., "Three Dimensional Reram Device", filed on Nov. 29, 2022, 67 pages, U.S. Appl. No. 18/059,672.

International Search Report dated Feb. 21, 2024, received in a corresponding foreign application, namely International Patent Application No. PCT/CN2023/132884, 9 pages.

* cited by examiner

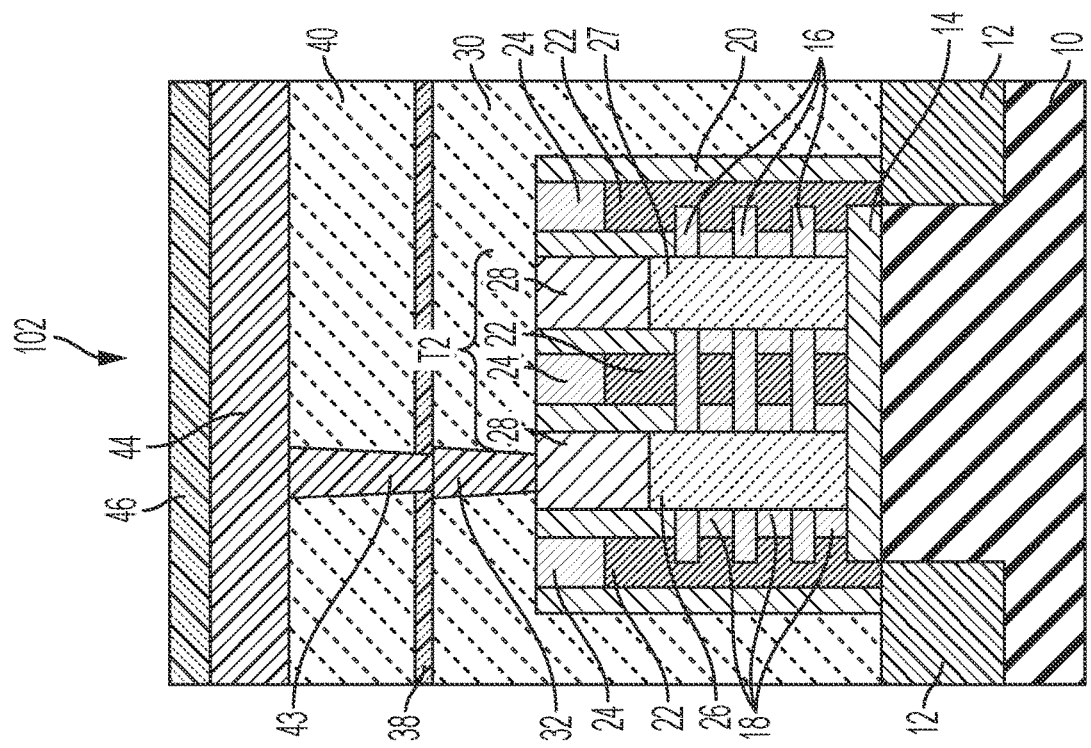
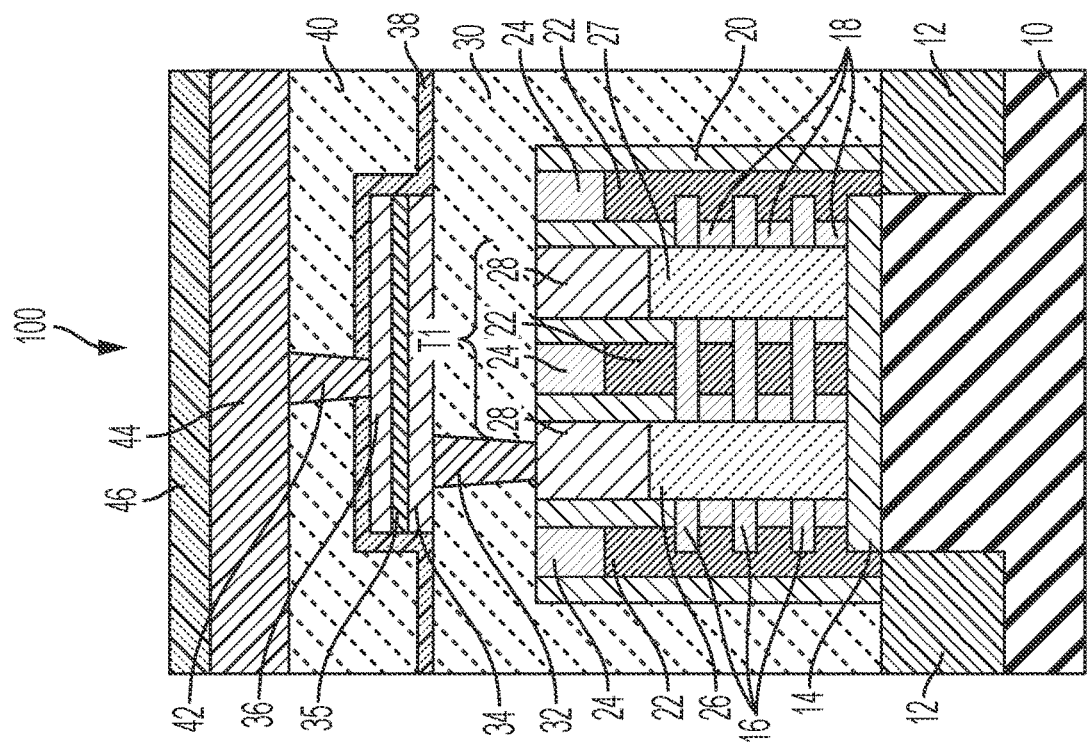
FIG. 1A
FIG. 1B

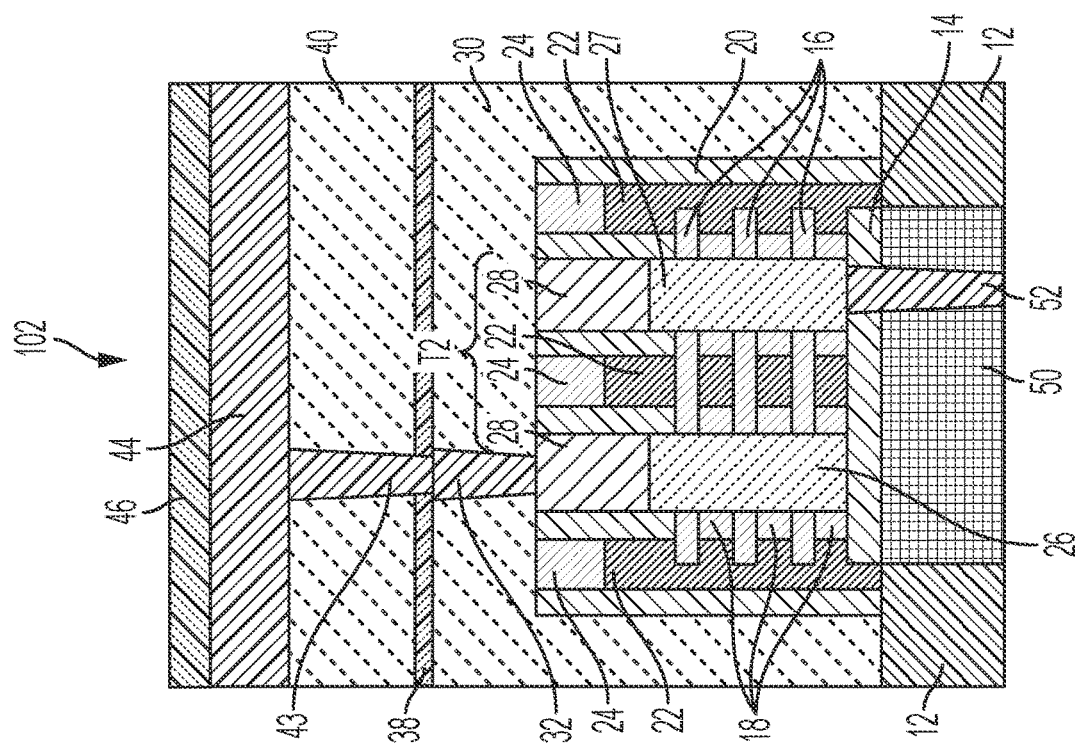
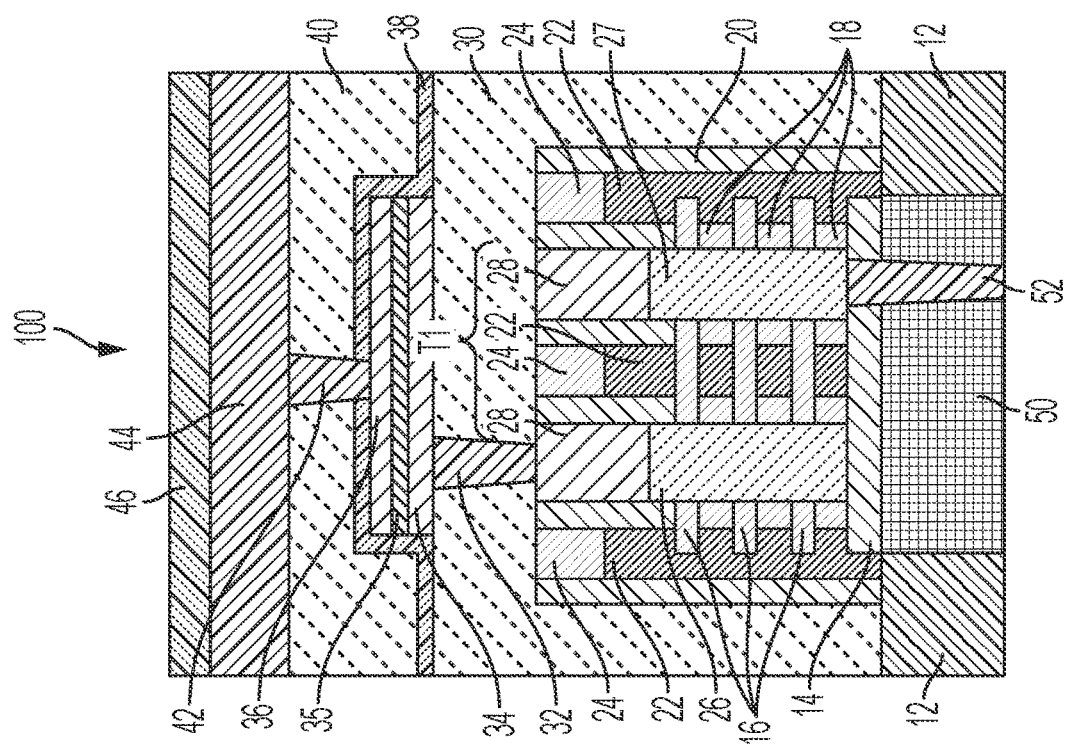
FIG. 4A
FIG. 4B

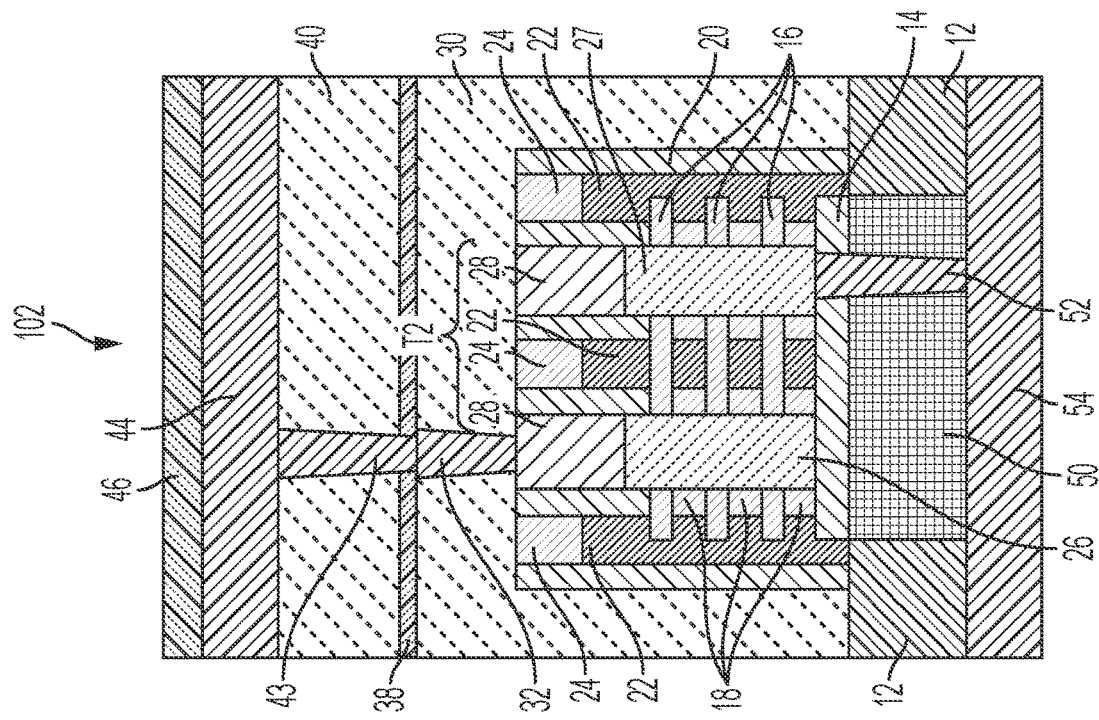
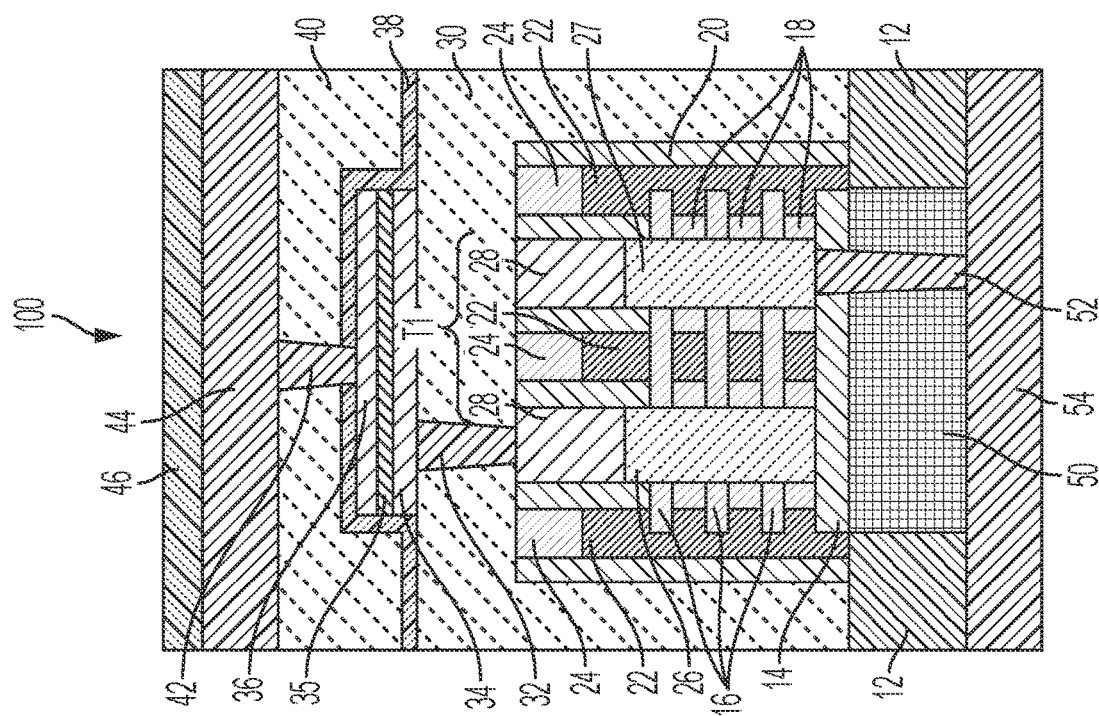
FIG. 5A
FIG. 5B

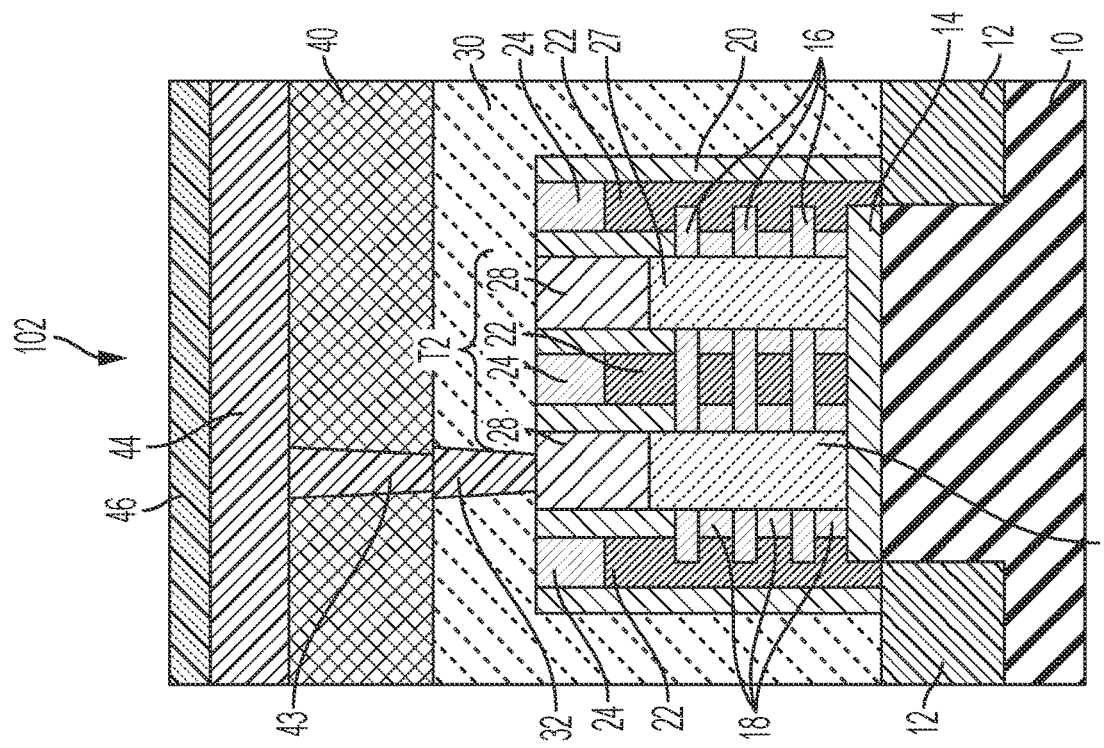
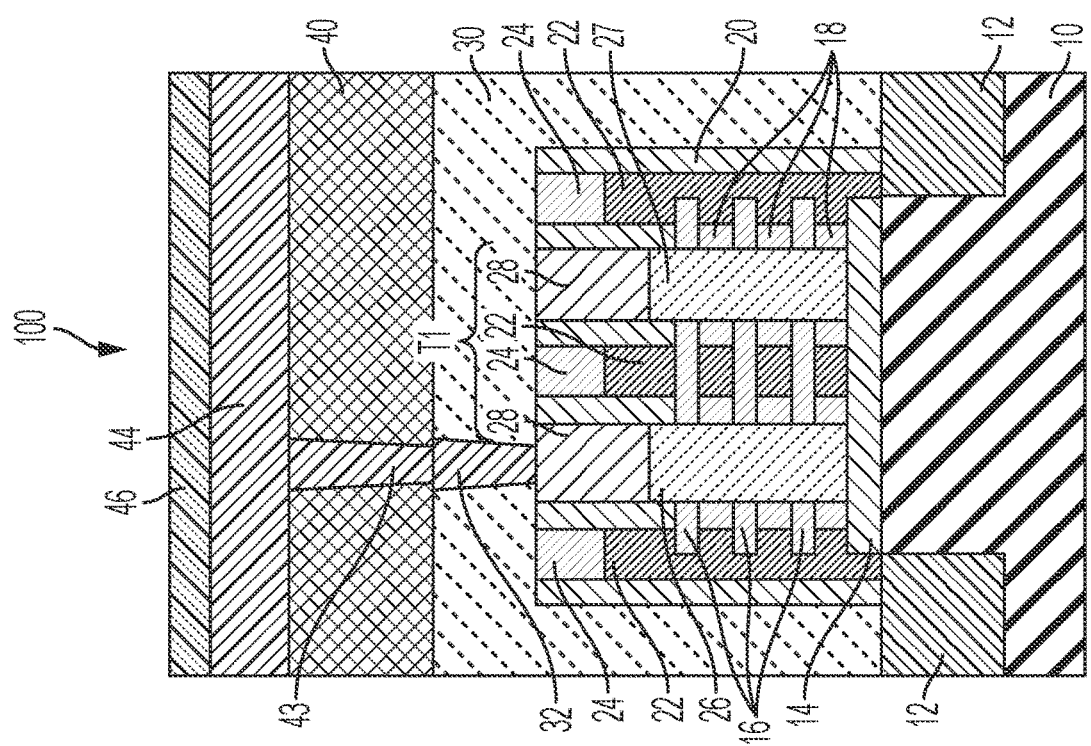
FIG. 6A
FIG. 6B

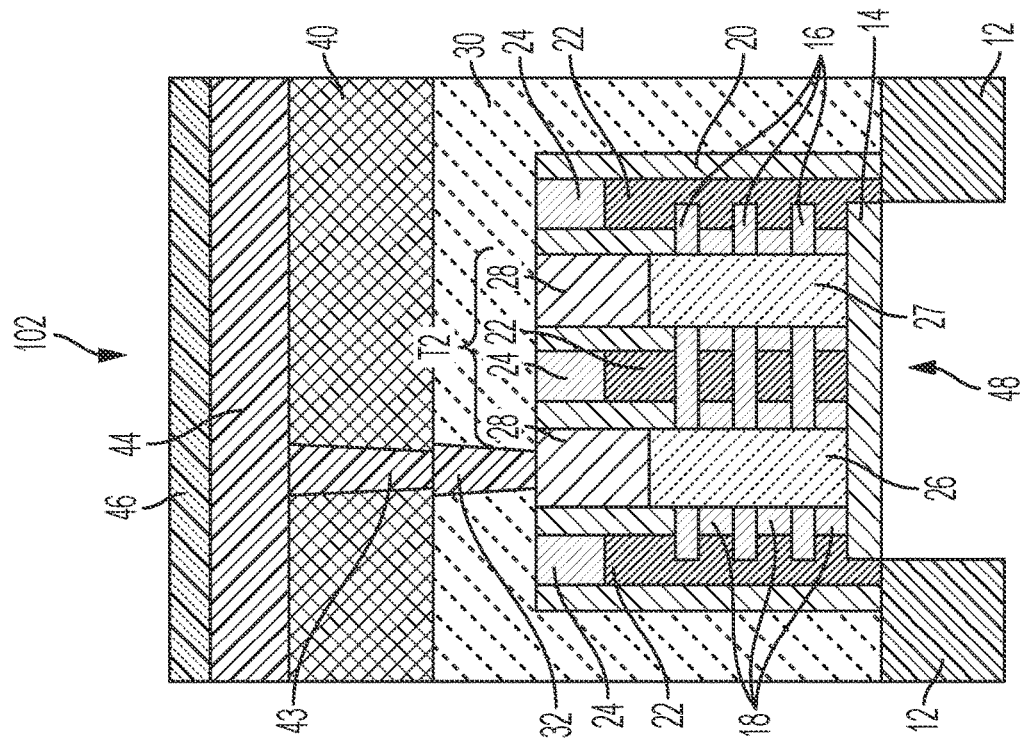
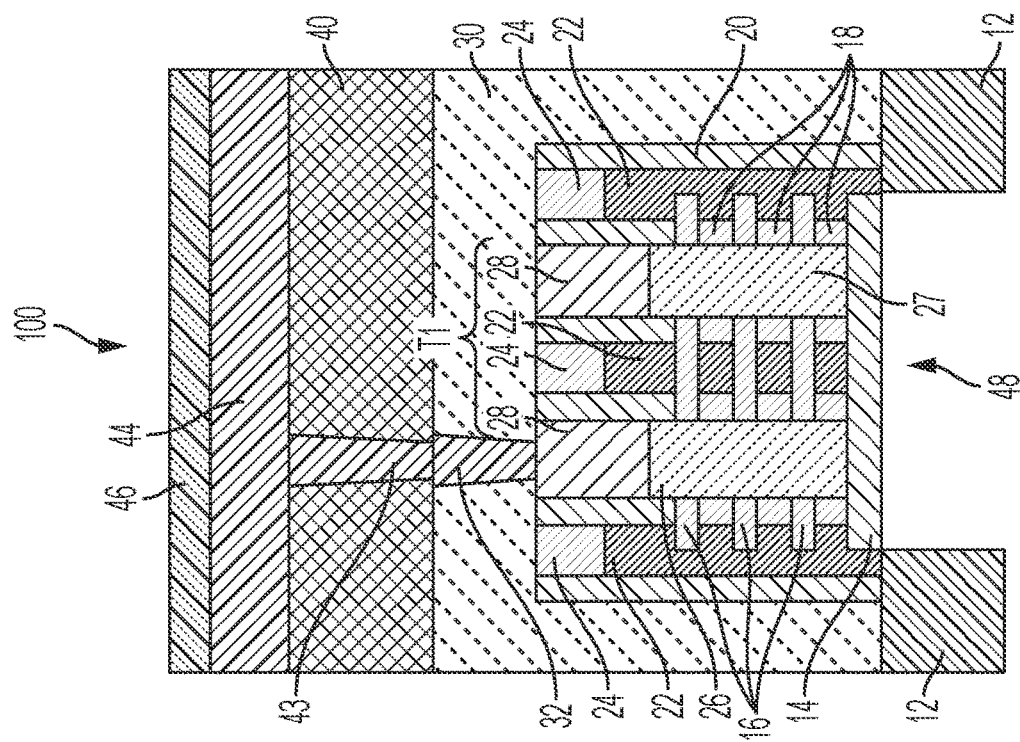
FIG. 7A
FIG. 7B

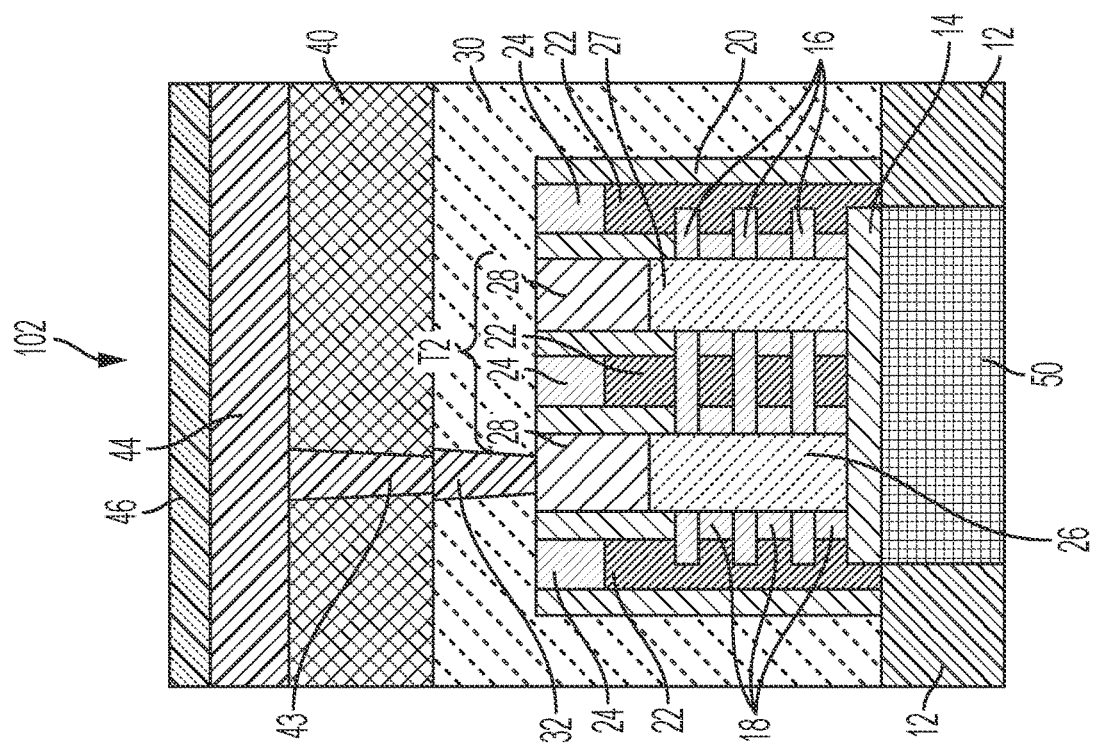
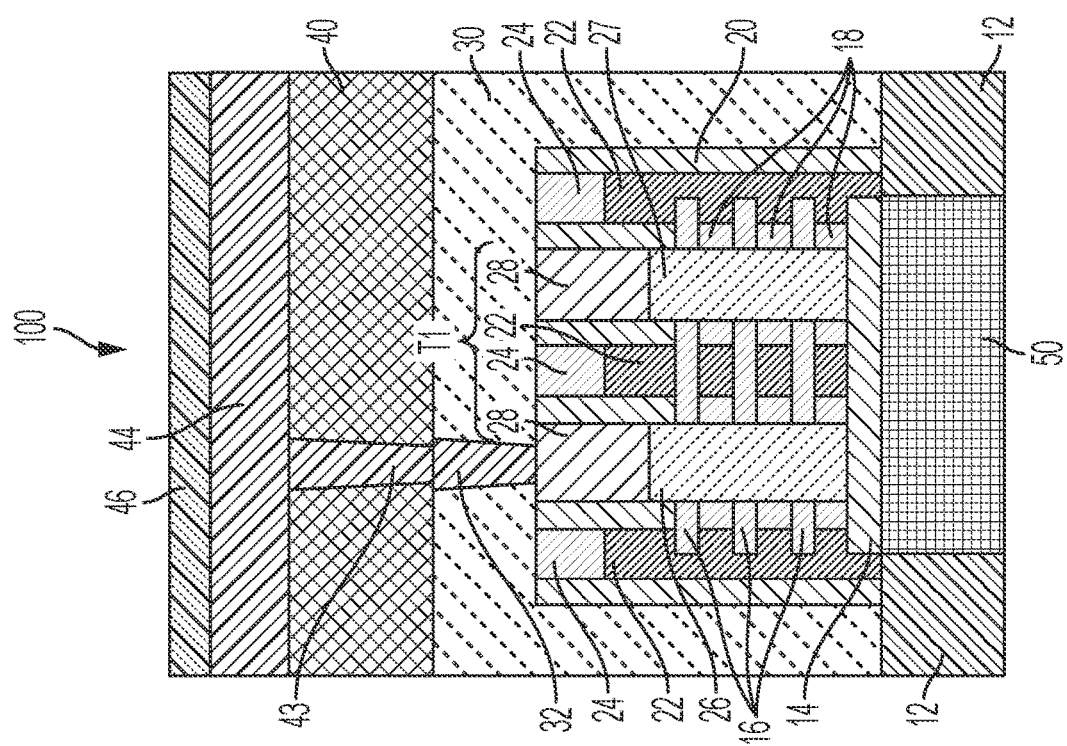
FIG. 8A
FIG. 8B

EMBEDDED RERAM WITH BACKSIDE CONTACT

BACKGROUND

The present application relates to semiconductor technology, and more particularly to a semiconductor structure including an embedded resistive random access memory (ReRAM) with a backside contact for lowering the forming voltage of the ReRAM.

Non-volatile memory (NVM) or non-volatile storage is a type of computer memory that can retain stored information even after the power is removed. In contrast, volatile memory needs constant power in order to retain data. NVMs, such as, for example. ReRAM (or sometime merely RRAM), phase change random access memory (PCRAM), and conductive bridge random access memory (CBRAM), are getting renewed attentions for potential applications to neuromorphic computing with in-memory processing capability which reduces power consumption significantly and eliminates data busing time between memory and the central processing unit (CPU) of conventional complementary metal oxide semiconductor (CMOS) based neuromorphic computing. ReRAM is considered as a promising technology for electronic synapse devices or memristors for neuromorphic computing as well as high-density and high-speed NVM applications. In neuromorphic computing applications, a resistance memory device such as ReRAM device can be used as a connection (i.e., synapse) between a pre-neuron and a post-neuron, representing the connection weight in form of device resistance.

SUMMARY

A semiconductor structure including a one-transistor one-capacitor (1T1R) device is provided that includes an embedded ReRAM that is present in a frontside or the backside of the structure, a frontside contact structure electrically connected to a source region of the transistor of the 1T1R device and a backside contact structure electrically connected to a drain region of the transistor of the 1T1R device. By placing these two contact structures are opposite sides of the structure a low voltage switching ReRAM can be achieved without increasing the size of the ReRAM or the forming voltage itself. The ReRAM can have a width larger than 1 gate pitch. Throughout the present application, the term "gate pitch" denotes a distance between one point of a gate structure to the exact point on a nearest neighboring gate structure.

In one embodiment (i.e., a frontside ReRAM embodiment) of the present application, the semiconductor structure includes a transistor located in a memory device region and including a gate structure, a source region located on a first side of the gate structure, and a drain region located on a second side of the gate structure, wherein the second side of the gate structure is opposite the first side of the gate structure. The structure further includes a ReRAM located in the memory device region and positioned above the transistor, a frontside contact structure electrically connecting the ReRAM to the source region of the transistor, and a backside contact structure electrically connecting the drain region of the transistor to a backside back-end-of-the-line (BEOL) structure. In this frontside ReRAM embodiment, the ReRAM switching area is effectively increased without increasing the gate pitch.

In this frontside ReRAM embodiment, the transistor can be a nanosheet transistor including a plurality of vertically stacked and spaced apart semiconductor channel material nanosheets, wherein the gate structure of the transistor wraps around a middle portion of each semiconductor channel material nanosheet of the plurality of vertically stacked and spaced apart semiconductor channel material nanosheets. In such an embodiment, the structure can further include a bottom dielectric isolation layer and a backside interlayer dielectric material layer located beneath the nanosheet transistor, wherein the backside contact structure passes through both the backside interlayer dielectric material layer and the bottom dielectric isolation layer and is in direct physical contact with the drain region of the transistor.

In this frontside ReRAM embodiment, the structure can further include a source/drain contact structure positioned between the frontside contact structure and the source region of the transistor, wherein the frontside contact structure is in direct physical contact with a first surface of the source/drain contact structure, and a second surface of the source/drain contact structure opposite the first surface, is in direct physical contact with the source region of the transistor.

In this frontside ReRAM embodiment, the structure can further include a frontside BEOL structure located above the ReRAM, wherein the frontside BEOL structure is electrically connected to a top electrode of the ReRAM by a frontside BEOL-to-ReRAM metal via. In such an embodiment, the frontside BEOL-to-ReRAM metal via passes through a dielectric material layer that is present on the ReRAM.

In this frontside ReRAM embodiment, the structure can further include a carrier wafer located on a surface of the frontside BEOL structure.

In this frontside ReRAM embodiment, the ReRAM is embedded in a frontside interlayer dielectric material layer.

In this frontside ReRAM embodiment, the structure can further include a logic device area located adjacent to the memory device region, wherein the logic device area includes another transistor, the another transistor including another gate structure, another source region located on a first side of the another gate structure, and another drain region located on a second side of the another gate structure, wherein the second side of the another gate structure is opposite the first side of the another gate structure. In such an embodiment, the structure can further include another frontside contact structure electrically connecting the another source region of the another transistor to a frontside BEOL structure, and another backside contact structure electrically connecting the another drain region of the another transistor to a backside BEOL structure.

In another embodiment (i.e., a backside ReRAM embodiment) of the present application, the semiconductor structure includes a transistor located in a memory device region and including a gate structure, a source region located on a first side of the gate structure, and a drain region located on a second side of the gate structure, wherein the second side of the gate structure is opposite the first side of the gate structure. The structure of this backside ReRAM embodiment further includes a ReRAM located in the memory device region and positioned beneath the transistor, a frontside contact structure electrically connecting the source region of the transistor to a frontside BEOL structure, and a backside contact structure electrically connecting the drain region of the transistor to the ReRAM. In this backside ReRAM embodiment, the ReRAM switching area is effectively increased without increasing the gate pitch.

In this backside ReRAM embodiment, the transistor is a nanosheet transistor including a plurality of vertically stacked and spaced apart semiconductor channel material nanosheets, wherein the gate structure of the transistor wraps around a middle portion of each semiconductor channel material nanosheet of the plurality of vertically stacked and spaced apart semiconductor channel material nanosheets. In such an embodiment, the structure can further include a bottom dielectric isolation layer and a backside interlayer dielectric material layer located beneath the nanosheet transistor, wherein the backside contact structure passes through both the backside interlayer dielectric material layer and the bottom dielectric isolation layer and is in direct physical contact with the drain region of the transistor.

In this backside ReRAM embodiment, the structure can further include a source/drain contact structure positioned between the frontside contact structure and the source region of the transistor, wherein the frontside contact structure is in direct physical contact with a first surface of the source/drain contact structure, and a second surface of the source/drain contact structure opposite the first surface, is in direct physical contact with the source region of the transistor.

In this backside ReRAM embodiment, the structure can further include a frontside metal via positioned between the frontside contact structure and the frontside BEOL structure, wherein the frontside metal via has a first surface directly contacting the frontside BEOL structure, and a second surface, that is opposite the first surface, directly contacting frontside contact structure.

In this backside ReRAM embodiment, the structure can further include a backside BEOL structure located beneath the ReRAM, wherein the backside BEOL structure is electrically connected to a bottom electrode of the ReRAM by a backside BEOL-to-ReRAM metal via.

In this backside ReRAM embodiment, the structure can further include a carrier wafer located on a surface of the frontside BEOL structure.

In this backside ReRAM embodiment, the ReRAM is embedded in a backside interlayer dielectric material layer.

In this backside ReRAM embodiment, the structure can further include a logic device area located adjacent to the memory device region, wherein the logic device area includes another transistor, the another transistor including another gate structure, another source region located on a first side of the another gate structure, and another drain region located on a second side of the another gate structure, wherein the second side of the another gate structure is opposite the first side of the another gate structure. In such an embodiment, the structure can further include another frontside contact structure electrically connecting the another source region of the another transistor to a frontside BEOL structure, and another backside contact structure electrically connecting the another drain region of the another transistor to a backside BEOL structure.

BRIEF DESCRIPTION OF THE DRAWINGS

FIG. 1A is a cross sectional view of an exemplary structure that is present in a memory device region of a semiconductor substrate, the exemplary structure including a transistor, a ReRAM, a frontside contact structure, a frontside BEOL structure and a carrier wafer, all present on the frontside of the semiconductor substrate.

FIG. 1B is a cross sectional view of an exemplary structure that is present in a logic device region of the semiconductor substrate, the logic device region is located adjacent to the memory device region illustrated in FIG. 1A, wherein the exemplary structure in the logic device region includes a transistor, a frontside contact structure, a frontside BEOL structure and a carrier wafer, all present on the frontside of the semiconductor substrate.

FIGS. 4A-4B are cross sectional views of the exemplary structures shown in FIGS. 3A-3B, respectively, after forming a backside contact structure in both the memory device region and the logic device region.

FIGS. 5A-5B are cross sectional views of the exemplary structures shown in FIGS. 4A-4B, respectively, after forming a backside BEOL structure.

FIG. 6A is a cross sectional view of another exemplary structure that is present in a memory device region of a semiconductor substrate, the exemplary structure including a transistor, a frontside contact structure, a frontside BEOL structure and a carrier wafer, all present on the frontside of the semiconductor substrate.

FIG. 6B is a cross sectional view of another exemplary structure that is present in a logic device region of the semiconductor substrate, the logic device region is located adjacent to the memory device region illustrated in FIG. 6A, wherein the another exemplary structure in the logic device region includes a transistor, a frontside contact structure, a frontside BEOL structure and a carrier wafer, all present on the frontside of the semiconductor substrate.

FIGS. 7A-7B are cross sectional views of the exemplary structures shown in FIGS. 6A-6B, respectively, after removing the semiconductor substrate to allow backside processing in both the memory device region and the logic device region.

FIGS. 8A-8B are cross sectional views of the exemplary structures shown in FIGS. 7A-7B, respectively, after forming a first backside interlayer dielectric material layer in both the memory device region and the logic device region.

DETAILED DESCRIPTION

Figure 2A:
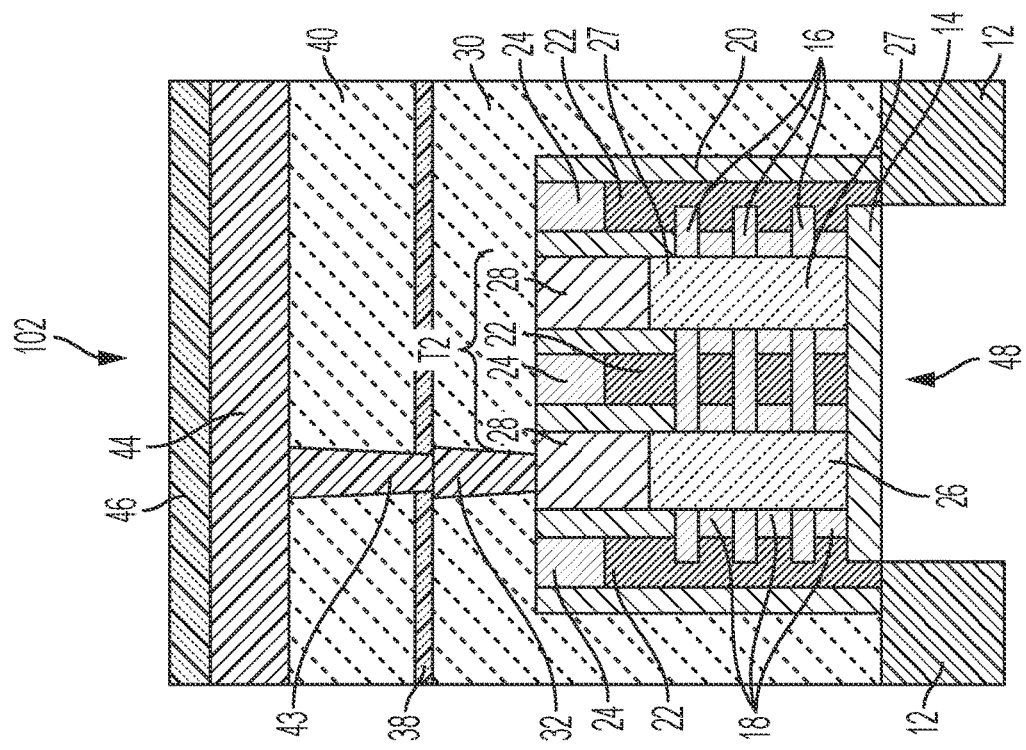
FIGS. 2A-2B are cross sectional views of the exemplary structures shown in FIGS. 1A-1B, respectively, after removing the semiconductor substrate to allow backside processing in both the memory device region and the logic device region.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Conventional filamentary switching ReRAM devices require a forming step to create soft breakdown. On one hand, as the switching area scales down, the forming voltage increases, such that an additional external device is required, which results in power consumption. On the other hand, if the ReRAM switching area increases to reduce the forming voltage, there is an area penalty. The present application solves the above problem by providing a 1T1R device in which the ReRAM (which serves as a memory element in the 1T1R structure) is present on either the frontside or the backside of the device, and wherein the source contact and the drain contact are located on opposite sides of the device. Notably, and in the present application, a frontside contact is present on the frontside of the device which is electrically connected to the source region of the transistor, and a backside contact structure is present on the backside of the device that is electrically connected to the drain region of the transistor. Here, the frontside of the device is a region that includes, and is located above, the transistor, while the backside of the device is the region that is located beneath the transistor. As such, the ReRAM switching area is not restricted by the drain contact (as is in the case in conventional 1T1R device). In the present application, the ReRAM size can be larger than 1 gate pitch. This aspect of the present application can reduce the forming voltage without increasing the 1T1R device size.

In the present application and is will be illustrated in FIGS. 1A-10B, a memory device region 100 and a logic device region 102 are typically present. The logic device region 102 is located adjacent to the memory device region 100. In the present application, the transistors that are present in the memory device region 100 and the logic device region 102 are located on a same semiconductor substrate 10. The memory device region 100 includes a 1T1R device comprising a ReRAM and transistor, T1. The ReRAM can be located on a frontside or a backside of the semiconductor substate 10. The logic device region 102 also includes a transistor. T2. In the memory device region 100 and the logic device region 102, a frontside contact is made to the source region of the transistor that is present in each respective device region, and a backside contact is made to the drain region of the transistor in each respective device region. This provides a low voltage switching ReRAM in the memory device region 100 without having to increase the size of the ReRAM.

In the present application, the term "transistor" denotes a three terminal device including a gate electrode, a source region and a drain region; the gate electrode is a component of a gate structure. In the present application, the transistors in memory device region 100 and the logic device region are both illustrated as nanosheet transistors. The term "nanosheet transistor" denotes a type of transistor in which the channel of the transistor is a plurality of vertically stacked and spaced apart semiconductor channel material nanosheets. In nanosheet transistors, the gate structure wraps around each of the semiconductor channel material nanosheets of the plurality of vertically stacked and spaced apart semiconductor channel material nanosheets. Nanosheet transistors are advantageous here for the present application since such transistors typically include a bottom dielectric isolation layer that will permit backside processing without negatively impacting the channel of the transistor. In some embodiments, a transistor formed on a semiconductor-on-insulator substrate can be used in place of the nanosheet transistors since the semiconductor-on-insulator substrate includes a buried insulation layer.

Referring now to FIG. 1A, there is illustrated an exemplary structure that is present in a memory device region 100 of a semiconductor substrate 10, the exemplary structure includes a transistor, T1, a ReRAM 34/35/36, a frontside contact structure 32, a frontside BEOL structure 44 and a carrier wafer 46, all present on the frontside of the semiconductor substrate 10. The transistor, T1, present in the memory device region 100 includes a plurality of vertically stacked and spaced apart semiconductor channel material nanosheets 16, gate structure 22 wrapped around a middle portion of each semiconductor channel material nanosheet 16, a source region 26 located on one side of the gate structure 22 and a drain region 27 located on an opposite side of the gate structure 22. The exemplary structure also shows dummy gate regions to the left and right of the transistor, T1. Each dummy gate region also includes at least a gate structure 22 that wraps around an end portion of each of the semiconductor channel material nanosheets 16; the dummy transistors lack at least one of a source region or a drain region. Also present in the memory device region 100 are: a shallow trench isolation structure 12, inner spacers 18, gate spacers 20, gate cap 24, frontside source/drain contact structures 28, a first frontside interlayer dielectric material layer 30, dielectric material layer 38, second frontside interlayer dielectric material layer 40, and a frontside BEOL-to-ReRAM metal via 42. In the present application, the shallow trench isolation structure 12 is formed in the semiconductor substrate 10 and it can surround an unetched portion of the semiconductor substrate 10. The structure further includes a bottom dielectric isolation layer 14 present between the transistor, T1, and the semiconductor substrate 10.

As is illustrated in FIG. 1A, the ReRAM 34/35/36 is a frontside ReRAM that is located above the transistor, T1, that is present in the memory device region 100. As further illustrated in FIG. 1A, the frontside contact structure 32 electrically connects the ReRAM 34/35/36 to the source region 26 of the transistor, T1; one of the frontside source/drain contact structures 28 is positioned between the frontside contact structure 32 and the source region 26 of the transistor, T1, in the memory device region 100. In the present application, the frontside contact structure 32 has a first surface that physically contacts the frontside source/drain contact structure 28 and a second surface that is opposite the first surface that physically contacts a first electrode 34 of the ReRAM 34/35/36. Frontside BEOL-to-ReRAM metal via 42 electrically connects a second electrode 36 of the ReRAM 34/35/36 to the frontside BEOL structure 44, and carrier wafer 46 is located on the frontside BEOL structure 44. Dielectric material layer 38 is present along a topmost surface and a sidewall surface of the ReRAM 34/35/36; this dielectric material layer is also present between the first frontside interlayer dielectric material layer 30 and the second frontside interlayer dielectric material layer 40. In this embodiment of the present application and as is illustrated in FIG. 1A, the first frontside interlayer dielectric material layer 30 embeds the transistors, T1, and dummy transistors, the frontside source/drain contact structures 28, the frontside contact structure 32, the bottom dielectric isolation layer 14, and the second frontside interlayer dielectric material layer 40 embeds at least the ReRAM 34/35/36 and the frontside BEOL-to-ReRAM metal via 42.

Referring now to FIG. 1B, there is illustrated an exemplary structure that is present in a logic device region 102 of the semiconductor substrate 10. It is noted that the logic device region 102 and the memory device region 100 are present on the same substrate, i.e., semiconductor substrate 10. The logic device region 102 is located adjacent to the memory device region 100 illustrated in FIG. 1A, and the exemplary structure in the logic device region 102 includes a transistor, T2, a frontside contact structure, 32 frontside BEOL structure 44 and carrier wafer 46, all present on the frontside of the semiconductor substrate 10. The transistor, T2, present in the logic device region 102 includes a plurality of vertically stacked and spaced apart semiconductor channel material nanosheets 16, gate structure 22 wrapped around a middle portion of each semiconductor channel material nanosheet 16, a source region 26 located on one side of the gate structure 22 and a drain region 27 located on an opposite side of the gate structure 22. The exemplary structure also shows dummy gate regions to the left and right of the transistor, T2. Each dummy gate region also includes at least a gate structure 22 that wraps around an end portion of each of the semiconductor channel material nanosheets 16; the dummy transistors lack at least one of a source region or a drain region. Also present in the logic device region 102 are: shallow trench isolation structure 12, inner spacers 18, gate spacers 20, gate cap 24, frontside source/drain contact structures 28, first frontside interlayer dielectric material layer 30, dielectric material layer 38, second frontside interlayer dielectric material layer 40, and a frontside metal via 43. The structure shown in FIG. 1B further includes a bottom dielectric isolation layer 14 present between the transistor, T2, and the semiconductor substrate 10.

As is illustrated in FIG. 1B, the frontside contact structure 32 electrically connects the frontside BEOL structure 44 to the source region 26 of the transistor, T2; one of the frontside source/drain contact structures 28 is positioned between the frontside contact structure 32 and the source region 26 of the transistor, T2, in the logic device region 102. In the present application, the frontside contact structure 32 has a first surface that physically contacts the frontside source/drain contact structure 28 and a second surface that is opposite the first surface that physically contacts metal via 43 that is positioned between the frontside BEOL structure 44 and the frontside contact structure 32. In logic device region 102, the dielectric material layer 38 is present between the first frontside interlayer dielectric material layer 30 and the second frontside interlayer dielectric material layer 40. In this embodiment of the present application and as is illustrated in FIG. 1B, the first frontside interlayer dielectric material layer 30 embeds the transistors, T2, and dummy transistors, the frontside source/drain contact structure 28, the frontside contact structure 32, the bottom dielectric isolation layer 14, and second frontside interlayer dielectric material layer 40 embeds at least metal via 43.

The semiconductor substrate 10 that is present in both the memory device region 100 and the logic device region 102 is composed of at least one semiconductor material having semiconducting properties. Examples of semiconductor materials that can be used to provide the semiconductor substrate 12 include, but are not limited to, silicon (Si), a silicon germanium (SiGe) alloy, a silicon germanium carbide (SiGeC) alloy, germanium (Ge), III/V compound semiconductors or II/VI compound semiconductors.

The shallow trench isolation structure 12 that is present in both the memory device region 100 and the logic device region 102 can include a trench dielectric material, and an optional trench liner. When present, the trench liner is formed along a sidewall and a bottom wall of the trench dielectric material. The trench dielectric material can be composed of any trench dielectric such as, for example, silicon oxide, while the trench liner can be composed of any trench liner material such as, for example, silicon nitride.

The bottom dielectric isolation layer 14 that is present in both the memory device region 100 and the logic device region 102 is composed of a spacer dielectric material including, but not limited to, SiN, SiBCN, SiOCN, SiON or SiOC. Typically, but not necessarily always, the spacer dielectric material that provides the bottom dielectric isolation layer 14 is compositionally the same as the spacer dielectric material that provides the gate spacer 20.

Each semiconductor channel material nanosheet 16 is composed of one of the semiconductor materials mentioned above for the semiconductor substrate 10. In one example, each semiconductor channel material nanosheet 16 is composed of Si or SiGe. In some embodiments, each semiconductor channel material nanosheet 16 can be composed of a semiconductor material that is capable of providing high channel mobility for nFET devices. In other embodiments, each semiconductor channel material nanosheet 16 can be composed of a semiconductor material that is capable of providing high channel mobility for pFET devices. Each semiconductor channel material nanosheet 16 typically has a width from 6 nm to 100 nm, and a vertical height from 4 nm to 15 nm.

Each inner spacer 18 is located beneath each semiconductor channel material nanosheet 16. Each inner spacer 18 is composed of a spacer dielectric material including, but not limited to, SiN, SiBCN, SiOCN, SiON or SiOC.

Each gate spacer 20 that is present along a sidewall of the gate structures 22 can also be composed of a spacer dielectric material. The spacer dielectric material that provides the gate spacer 20 can be compositionally the same as, or compositionally different from, the dielectric spacer material that provides the inner spacer 18.

The gate structure 22 includes a gate dielectric material and a gate electrode, both of which are not separately shown, but intended to be within region defined by the gate structure 22. As is known to those skilled in the art, the gate dielectric material directly contacts a physically exposed surface(s) of each semiconductor channel material structure, and the gate electrode is formed on the gate dielectric material. The gate dielectric material of the gate structure 22 has a dielectric constant of 4.0 or greater. All dielectric constants mentioned herein are measured in a vacuum unless otherwise indicated. Illustrative examples of gate dielectric materials include, but are not limited to, silicon dioxide, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide (BaO$_6$SrTi$_2$), barium titanium oxide (BaTiO$_3$), strontium titanium oxide (SrTiO$_3$), yttrium oxide (Yb$_2$O$_3$), aluminum oxide (Al$_2$O$_3$), lead scandium tantalum oxide (Pb(Sc,Ta)O$_3$), and/or lead zinc niobite (Pb(Zn,Nb)O). The gate dielectric material can further include dopants such as La, Al and/or Mg.

The gate electrode of the gate structure 22 can include a work function metal (WFM) and optionally a conductive metal. The WFM can be used to set a threshold voltage of the transistor to a desired value. In some embodiments, the WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the WFM-containing material towards a valence band of silicon in the silicon containing material. Examples of such materials that can effectuate a p-type threshold voltage shift include, but are not limited to, titanium nitride, and tantalum carbide, hafnium carbide, and combinations thereof. The optional conductive metal can include, but is not limited to, Al, W, or Co.

Each gate cap 24 that is present in the memory device region 100 and the logic device region 102 can be composed of a dielectric hard mask material such as, for example, silicon nitride and/or silicon oxynitride. The gate cap 24 is present on a topmost surface of the gate structure 22 and is laterally surrounded by an upper portion of the gate spacer 20; a lower portion of the gate spacer 20 laterally surrounds the gate structure 20. At this point of the present application, a topmost surface of the gate cap 24 is coplanar with a topmost surface of the gate spacer 20.

The source region 26 and the drain region 27 that are present in the memory device region 100 and the logic device region 102 include a semiconductor material and a dopant. The dopant can be either an n-type dopant or a p-type dopant, both as defined herein below. The semiconductor material that provides the source region 26 and drain region 27 includes one of the semiconductor materials mentioned above in providing the semiconductor substrate 10. The semiconductor material that provides the source region 26 and drain region 27 can be compositionally the same as, or compositionally different from, the semiconductor material that provides each semiconductor channel material nanosheet 16. The term "n-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. The concentration of the n-type or p-type dopant in the source region 26 and drain region 27 can range from $1 \times 10^{18}$ atoms/cm$^3$ to $1 \times 10^{21}$ atoms/cm$^3$, although dopant concentrations greater than $1 \times 10^{21}$ atoms/cm$^3$ or less than $1 \times 10^{18}$ atoms/cm$^3$ are also conceived.

The first interlayer dielectric material layer 30 that is present in the memory device region 100 and the logic device region 102 can be composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0. The first interlayer dielectric material layer 30 typically includes a plurality of the aforementioned dielectric materials.

Each frontside source/drain contact structure 28 that is present in the memory device region 100 and the logic device region 102 is located on a surface of the source region 26 and on a surface of the drain region 27. Each frontside source/drain contact structure 28 is composed of at least a contact conductor material. The contact conductor material can include, for example, a silicide liner, such as Ni, Pt, NiPt, an adhesion metal liner, such as TiN, and conductive metals such as W, Cu, Al, Co, Ru, Mo, Os, Ir, Rh, or an alloy thereof. Each frontside source/drain contact structure 28 can also include one or more contact liners (not shown). In one or more embodiments, the contact liner (not shown) can include a diffusion barrier material. Exemplary diffusion barrier materials include, but are not limited to, Ti, Ta, Ni, Co. Pt, W, Ru, TiN, TaN, WN, WC, an alloy thereof, or a stack thereof such as Ti/TiN and Ti/WC. In one or more embodiments in which a contact liner is present, the contact liner (not shown) can include a silicide liner, such as Ti, Ni, NiPt, etc., and a diffusion barrier material, as defined above.

The frontside contact structure 32 that is present in the memory device region 100 and the logic device region 102 is composed of at least a contact conductor material, as mentioned above for the frontside source/drain contact structures 28. The frontside contact structure 32 can also include a diffusion barrier material as defined above present along a sidewall and a bottom wall of the frontside contact structure 32. In the memory device region 100, the frontside contact structure 32 and the frontside source/drain contact structure 28 electrically connect the frontside ReRAM 34/35/36 to the source region 26 of the transistor, T1.

The frontside ReRAM 34/35/36 includes a first electrode 34, a filament forming layer 35 (which can also be referred to herein as a dielectric switching layer), and a second electrode 36. The first electrode 34 can be composed of an electrically conductive material such as, for example, Ta, TaN, Ti, TiN, Ru, RuN, RuTa, RuTaN, Cu, Co, CoWP, CON, W. WN or any combination thereof. The first electrode 34 can have a thickness from 2 nm to 80 nm; other thicknesses are possible and can be used in the present application as the thickness of the first electrode 34. The filament forming layer 35 is composed of a dielectric material such as a dielectric metal oxide that has a dielectric constant of 4.0 or greater. The filament forming layer 35 is electrically insulating at this point of the present application and during operational use, a filament which is electrically conducting can be formed in the filament forming layer 35. Examples of dielectric metal oxides that can be employed as the filament forming layer 35 include, but are not limited to, hafnium oxide, tantalum oxide, titanium oxide, aluminum oxide, silicon dioxide or combinations thereof. In some embodiments, hydrogen can be present in the dielectric material that provides the filament forming layer 35. The filament forming layer 35 can have a thickness from 1 nm to 50 nm; other thicknesses however are contemplated can be used as the thickness of the filament forming layer 35. The second electrode 36 can include one of electrically conductive materials mentioned above for the first electrode 34. In some embodiments, the electrically conductive material that provides the second electrode 36 is compositionally the same as the electrically conductive material that provides the first electrode 34. In one example, the electrically conductive material that provides both the first electrode 34 and the second electrode 36 is composed of TiN. In other embodiments, the electrically conductive material that provides the second electrode 36 is compositionally different than the electrically conductive material that provides the first electrode 34. In one example, the electrically conductive material that provides the first electrode 34 is composed of TaN and the electrically conductive material that provides the second electrode 36 is composed of TiN. The ReRAM lateral width can be larger than 1 gate pitch.

The dielectric material layer 38 that is located on a topmost surface and sidewalls of the ReRAM 34/35/36 and on the first frontside interlayer dielectric material layer 30 can be composed of a dielectric hard mask material such as, for example, silicon nitride and/or silicon oxynitride. The dielectric material layer 38 that is present in the memory device region can be referred to as a dielectric encapsulation material layer. The dielectric material layer 38 can have a thickness from 5 nm to 50 nm; although other thicknesses are possible and can be used in the present application as the thickness of the dielectric material layer 38. The dielectric material layer 38 can be a conformal dielectric material layer. By "conformal" it is meant that a material layer has a vertical thickness along horizontal surfaces that is substantially the same (i.e., within ±10%) as the lateral thickness along vertical surfaces.

The second frontside interlayer dielectric material layer 40 is composed of a dielectric material as mentioned above for the first frontside interlayer dielectric material layer 30. The dielectric material that provides the second frontside interlayer dielectric material layer 40 can be compositionally the same as, or compositionally different from, the dielectric material that provides the first frontside interlayer dielectric material layer 30.

The frontside BEOL-to-ReRAM metal via 42 that is present in the memory device region 100 is composed of at least a contact conductor material, as mentioned above for the frontside source/drain contact structures 28. The frontside BEOL-to-ReRAM metal via 42 can also include a diffusion barrier material as defined above present along a sidewall and a bottom wall of the frontside BEOL-to-ReRAM metal via 42. In the memory device region 100, the frontside BEOL-to-ReRAM metal via 42 electrically connects the second (i.e., top) electrode 36 of the frontside ReRAM 34/35/36 to the frontside BEOL structure 44. As is illustrated, the frontside BEOL-to-ReRAM metal via 42 passes through the dielectric material layer 38 that is present on the topmost surface of the ReRAM 34/35/36.

In the logic device region 102, frontside metal via 43 is present that electrically connects the frontside BEOL structure 44 to the frontside contact structure 32. The frontside metal via 43 is composed of at least a contact conductor material, as mentioned above for the frontside source/drain contact structures 28. The frontside metal via 43 can also include a diffusion barrier material as defined above present along a sidewall and a bottom wall of the frontside metal via 43.

The frontside BEOL structure 44 that is present in the memory device region 100 and the logic device region 102 can include one or more interconnect dielectric material layers (including one of the dielectric materials mentioned above for the first frontside interlayer dielectric material layer 30) that contain one or more wiring regions (the wiring regions can include any electrically conductive metal (e.g., Cu) or metal alloy, (e.g., Cu-AL) embedded therein. The carrier wafer 46 can include one of the semiconductor materials mentioned above for the semiconductor substrate 10.

The exemplary structures shown in FIGS. 1A-1B can be formed utilizing a combination of front-end-of-the-line (FEOL) processing, middle-of-the-line (MOL) processing, and frontside BEOL processing, each of these processing steps are well known to those skilled in the art. The FEOL processing can include a conventional nanosheet device forming process that is also well known to those skilled in the art. The MOL processing and BEOL processing can include metallization processes that are also well known to those skilled in the art. Metallization can include forming an opening in at least one material layer, and then filling that opening with at least a conductive material. The filling can include deposition of the conductive material, followed by a planarization process such as, for example, chemical mechanical polishing (CMP). The BEOL processing also includes a ReRAM device processing step which is also well known to those skilled in the art. So as not to obscure the method of the present application, the details of the FEOL processing, the MOL processing and the BEOL processing are not provided herein.

Figure 2B:
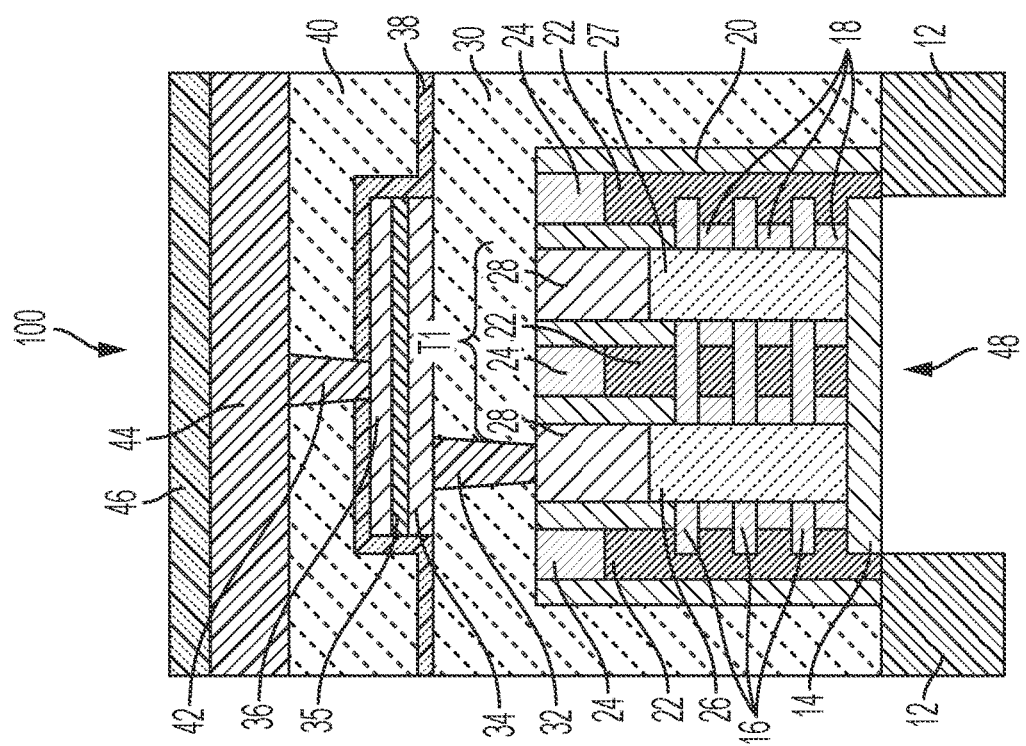

Referring now to FIGS. 2A-2B, there are illustrated the exemplary structures shown in FIGS. 1A-1B, respectively, after removing the semiconductor substrate 10 to allow backside processing in both the memory device region 100 and the logic device region 102. Prior to removing the semiconductor substrate 10, the wafer is typically flipped 180° to physically expose a backside of the semiconductor substrate 10; the flipping of the wafer is not shown in the drawings for simplicity. Backside processing occurs on a side of a wafer opposite the transistors. Flipping of the structure can be performed by hand or by utilizing a mechanical means such as, for example, a robot arm. The removal of the semiconductor substrate 10 can be performed utilizing a material removal process (e.g., a chemical wet etch) that is selective in removing the semiconductor material that provides the semiconductor substrate 10. This material removal process can include a single step or multiple steps can be used depending on the compositional make-up of the semiconductor substrate 10. Note that the material removal process that removes the semiconductor substrate 10 in both the memory device region 100 and the logic device region 102 forms a gap 48 between the shallow trench isolation structure 12 which physically exposes the bottom dielectric isolation layer 14.

Figure 3A:
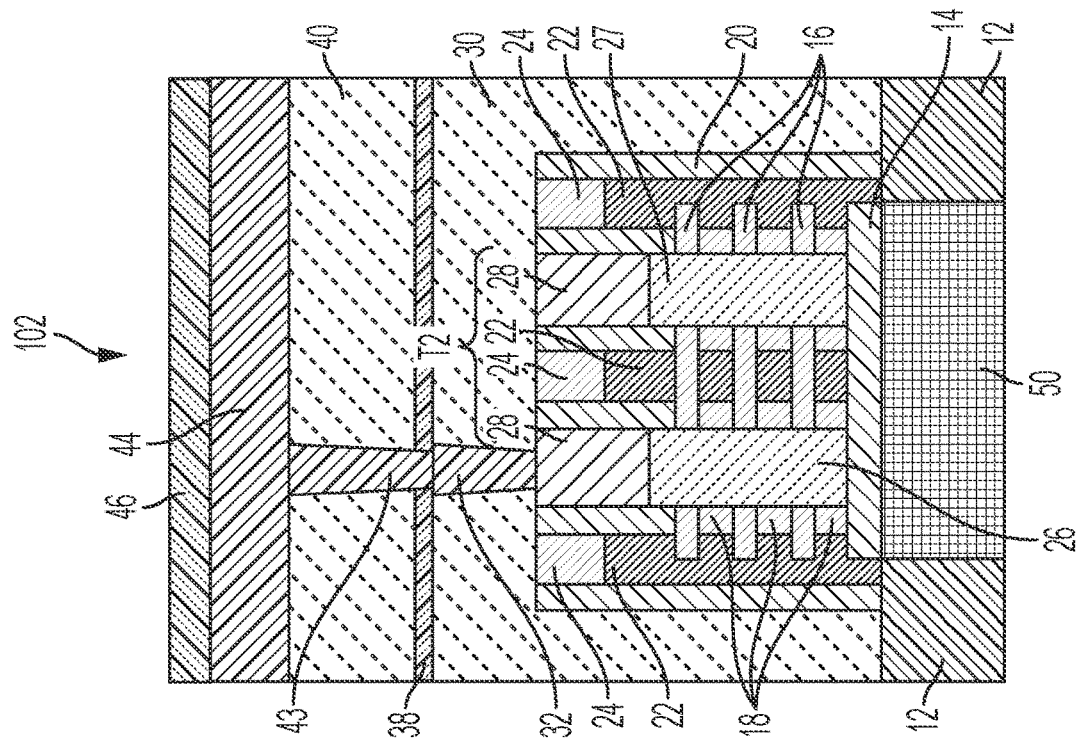
FIGS. 3A-3B are cross sectional views of the exemplary structures shown in FIGS. 2A-2B, respectively, after forming a backside interlayer dielectric material layer in both the memory device region and the logic device region.
Figure 3B:
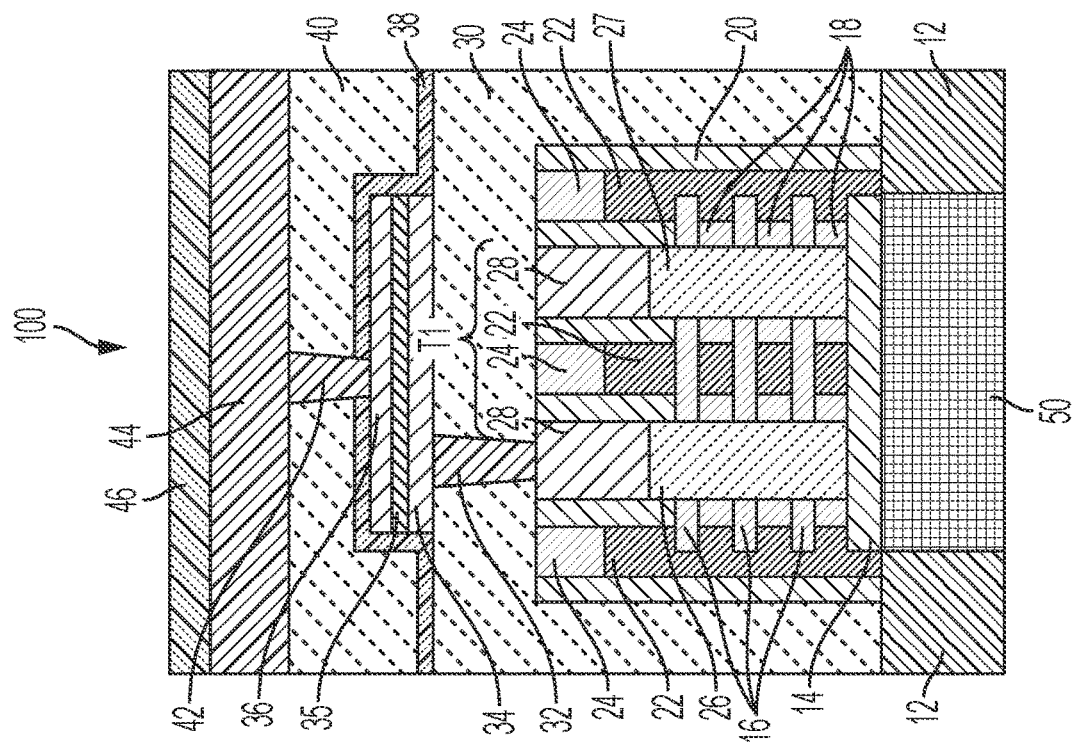

Referring now to FIGS. 3A-3B, there is illustrated the exemplary structures shown in FIGS. 2A-2B, respectively, after forming a backside interlayer dielectric material layer 50 in both the memory device region 100 and the logic device region 102. The backside interlayer dielectric material layer 50 is formed in each gap 48 that is formed by removing the semiconductor substrate 10 from the structures. The backside interlayer dielectric material layer 50 has a surface that directly contacts the bottom dielectric isolation layer 14 and another surface opposite the surface that contact the bottom dielectric isolation layer 14 that is coplanar with a physically exposed horizontal surface of the shallow trench isolation structure 12. The backside interlayer dielectric material layer 50 includes a dielectric material as mentioned above for the first frontside interlayer dielectric material layer 30. The backside interlayer dielectric material layer 50 can be formed by deposition, followed by planarization. The depositing of the backside interlayer dielectric material layer 50 can include chemical vapor deposition (CVD), plasma enhanced chemical vapor deposition (PECVD) or spin-on coating. The planarization can include CMP and/or grinding.

Referring now to FIGS. 4A-4B, there are illustrated the exemplary structures shown in FIGS. 3A-3B, respectively, after forming a backside contact structure 52 in both the memory device region 100 and the logic device region 102. Each backside contact structure 52 is in direct physical contact with drain region 27 of the respective transistor, i.e., T1 or T2, that is present in the specific device region. Each backside contact structure 52 passes through the backside interlayer dielectric material layer 50 and the bottom dielectric isolation layer 14. Each backside contact structure 52 is composed of at least a contact conductor material, as mentioned above for the frontside source/drain contact structures 28. Each backside contact structure 52 can also include a diffusion barrier material as defined above present along a sidewall and a bottom wall of each backside contact structure 52. Each backside contact structure 52 can be formed by a metallization process, as defined above.

Referring now to FIGS. 5A-5B, there are illustrated the exemplary structures shown in FIGS. 4A-4B, respectively, after forming a backside BEOL structure 54 in each of the memory device region 100 and the logic device region 102. The backside BEOL structure 54 includes materials as mentioned above for the frontside BEOL structure 44. The backside BEOL structure 54 can be formed utilizing any interconnect device process including, for example, a damascene process. As is illustrated, the backside contact structure 52 in the memory device region 100 electrically connects the drain region 27 of transistor, T1, to the backside BEOL structure 54, and the backside contact structure 52 in the logic device region 102 electrically connects the drain region 27 of transistor, T2, to the backside BEOL structure 54.

Notably, FIG. 5A illustrates a semiconductor structure in accordance with an embodiment of the present application that includes transistor, T1, located in memory device region 100. Transistor, T1, includes gate structure 22, source region 26 located on a first side of the gate structure 22, and drain region 27 located on a second side of the gate structure 22, wherein the second side of the gate structure 22 is opposite the first side of the gate structure 22. The structure further includes frontside ReRAM 34/35/36 located in the memory device region 100 and positioned above the transistor. T1. Frontside contact structure 32 is also present that electrically connects the frontside ReRAM 34/35/36 to the source region 26 of transistor, T1. Backside contact structure 52 is also present that electrically connects the drain region 27 of transistor, T1, to backside BEOL structure 54. In the structure illustrated in FIG. 5A, the frontside ReRAM 34/35/36 switching area is effectively increased without increasing the gate pitch. As this in an embedded memory application, there is wiring benefit for the structure (see, FIG. 5B) that is present in the logic device region 102.

Referring now to FIG. 6A, there is illustrated another exemplary structure that is present in memory device region 100 of semiconductor substrate 10, this exemplary structure includes transistor, T1, as defined above, frontside contact structure 32, frontside BEOL structure 44 and carrier wafer 46, all present on the frontside of the semiconductor substrate 10, and all composed of materials as mentioned above for the exemplary structures shown in FIGS. 1A-1B. The transistor. T1, shown in FIG. 6A is a nanosheet transistor that includes bottom dielectric isolation layer 14, semiconductor channel material nanosheets 16, inner spacer 18, gate spacer 20, gate structure 22, gate cap 24, source region 26, and drain region 27, all of which have been defined above in connection with the exemplary structure shown in FIGS. 1A-1B. The exemplary structure shown in FIG. 6A further includes source/drain contact structure 28, first frontside interlayer dielectric material layer 30 and second frontside interlayer dielectric material layer 40, each of which has been described above in regard to the structures shown in FIGS. 1A-1B. In this embodiment and in the memory device region 100, frontside metal via 43 is present in the second frontside interlayer dielectric material layer that electrically connects the frontside BEOL structure 44 to the frontside contact structure 32 that is present in the first frontside interlayer dielectric material layer 30. Note that no frontside ReRAM 34/35/36 or dielectric material layer 38 is present on the frontside of the exemplary structure shown in FIG. 6A. The frontside metal via 43 that is present in the memory device region 100 includes materials as mentioned above for the frontside metal via 43 that was present in the exemplary structure shown in FIG. 1B.

Referring now to FIG. 6B, there is illustrated another exemplary structure that is present in logic device region 102 of the semiconductor substrate 100, the logic device region 102 is located adjacent to the memory device region 100 illustrated in FIG. 6A. The another exemplary structure shown in FIG. 6B includes element as shown in FIG. 1B above. Note that no dielectric material layer 38 is present on the frontside of the logic device region 102 that separates the first frontside interlayer dielectric material layer 30 from the second frontside interlayer dielectric material layer 40.

The exemplary structures shown in FIGS. 6A-6B can be formed utilizing a combination of FEOL processing, MOL processing, and frontside BEOL processing, each of these processing steps are well known to those skilled in the art. The FEOL processing can include a conventional nanosheet device process that is also well known to those skilled in the art. The MOL processing and BEOL processing can include metallization processes (as defined above) that are also well known to those skilled in the art. So as not to obscure the method of the present application, the details of the FEOL processing, the MOL processing and the BEOL processing are not provided herein.

Referring now to FIGS. 7A-7B, there are illustrated the exemplary structures shown in FIGS. 6A-6B, respectively, after removing the semiconductor substrate 10 to allow backside processing in both the memory device region 100 and the logic device region 102. Prior to removing the semiconductor substrate 10, the wafer is typically flipped 180° to physically expose a backside of the semiconductor substrate 10; the flipping of the wafer is not shown in the drawings for simplicity. Backside processing occurs on a side of a wafer opposite the transistors. Flipping of the structure can be performed by hand or by utilizing a mechanical means such as, for example, a robot arm. The removal of the semiconductor substrate 10 can be performed utilizing a material removal process (e.g., a chemical wet etch) that is selective in removing the semiconductor material that provides the semiconductor substrate 10. This material removal process can include a single step or multiple steps can be used depending on the compositional make-up of the semiconductor substrate 10. Note that the material removal process that removes the semiconductor substrate 10 in both the memory device region 100 and the logic device region 102 forms a gap 48 between the shallow trench isolation structure 12 which physically exposes the bottom dielectric isolation layer 14.

Referring now to FIGS. 8A-8B, there are illustrated the exemplary structures shown in FIGS. 7A-7B, respectively, after forming a first backside interlayer dielectric material layer 50 in both the memory device region 100 and the logic device region 102. The backside interlayer dielectric material layer 50 is formed in each gap 48 that is formed by removing the semiconductor substrate 10 from the structures. The backside interlayer dielectric material layer 50 has a surface that directly contacts the bottom dielectric isolation layer 14 and another surface opposite the surface that contact the bottom dielectric isolation layer 14 that is coplanar with a physically exposed horizontal surface of the shallow trench isolation structure 12. The backside interlayer dielectric material layer 50 includes a dielectric material as mentioned above for the first frontside interlayer dielectric material layer 30. The backside interlayer dielectric material layer 50 can be formed by deposition, followed by planarization, as defined above for providing the backside interlayer dielectric material layer 50 illustrated in FIGS. 3A-3B.

Figure 9A:
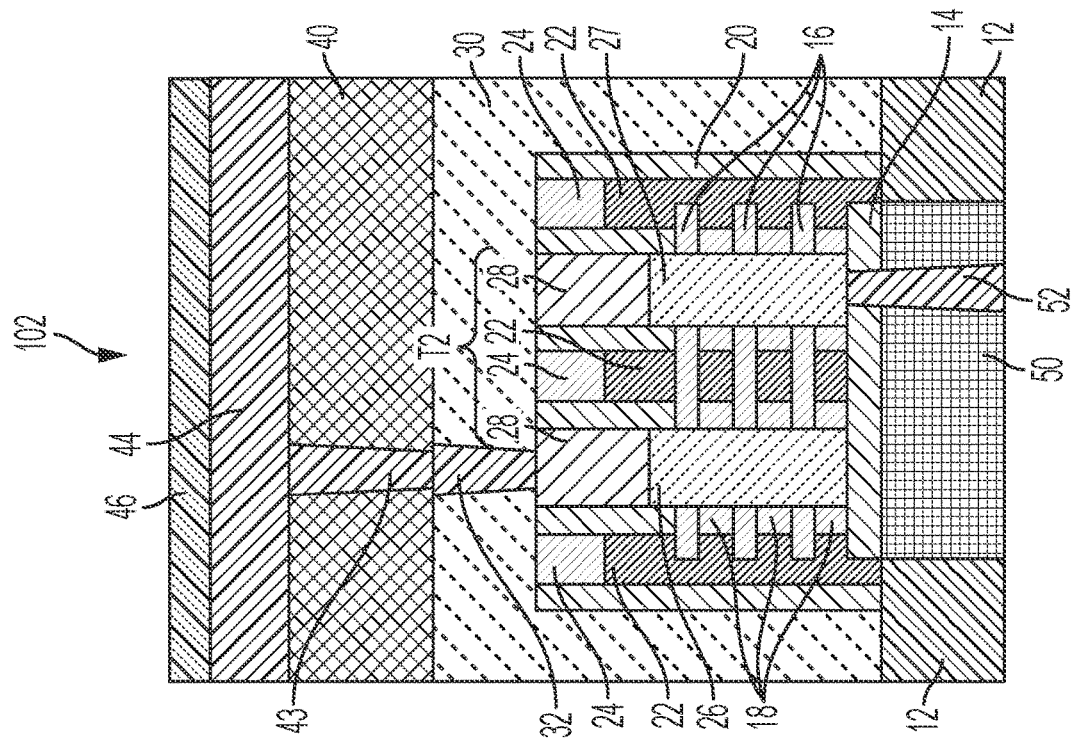
FIGS. 9A-9B are cross sectional views of the exemplary structures shown in FIGS. 8A-8B, respectively, after forming a backside contact structure in both the memory device region and the logic device region.
Figure 9B:
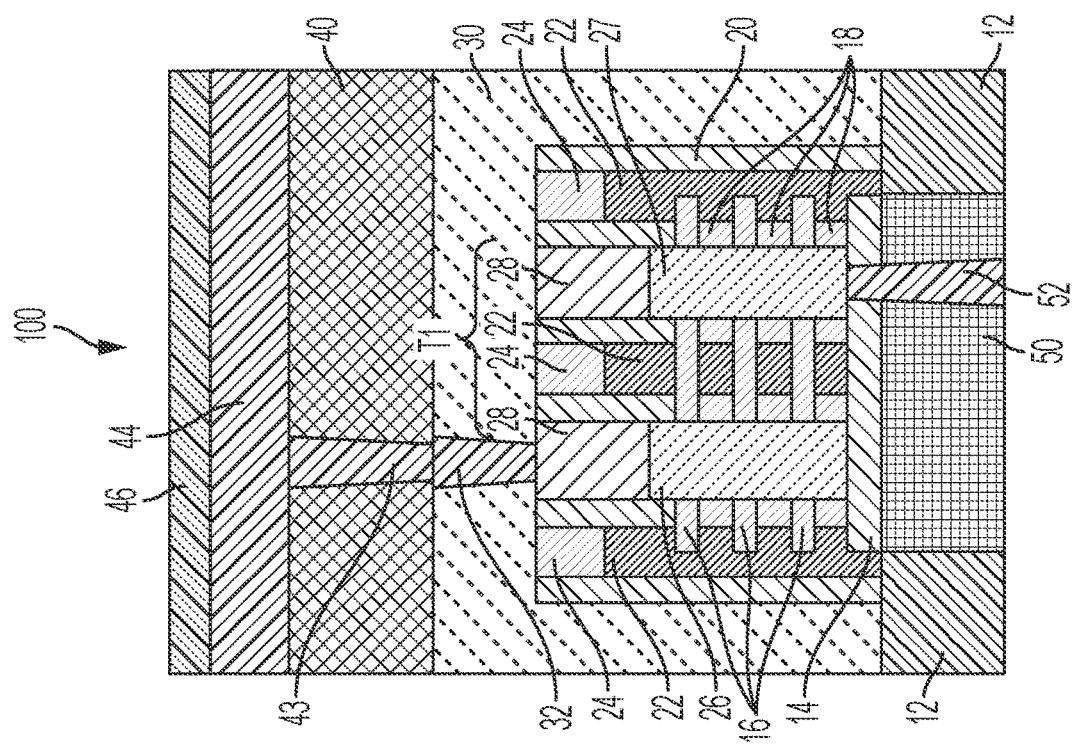

Referring now to FIGS. 9A-9B, there are illustrated the exemplary structures shown in FIGS. 8A-8B, respectively, after forming a backside contact structure 52 in both the memory device region 100 and the logic device region 102. Each backside contact structure 52 is in direct physical contact with a drain region of the respective transistor, i.e., T1 or T2, that is present in the specific device region. Each backside contact structure 52 passes through the backside interlayer dielectric material layer 50 and the bottom dielectric isolation layer 14. Each backside contact structure 52 is composed of at least a contact conductor material, as mentioned above for the frontside source/drain contact structures 28. Each backside contact structure 52 can also include a diffusion barrier material as defined above present along a sidewall and a bottom wall of each backside contact structure 52. Each backside contact structure 52 can be formed by a metallization process, as defined above.

Figure 10A:
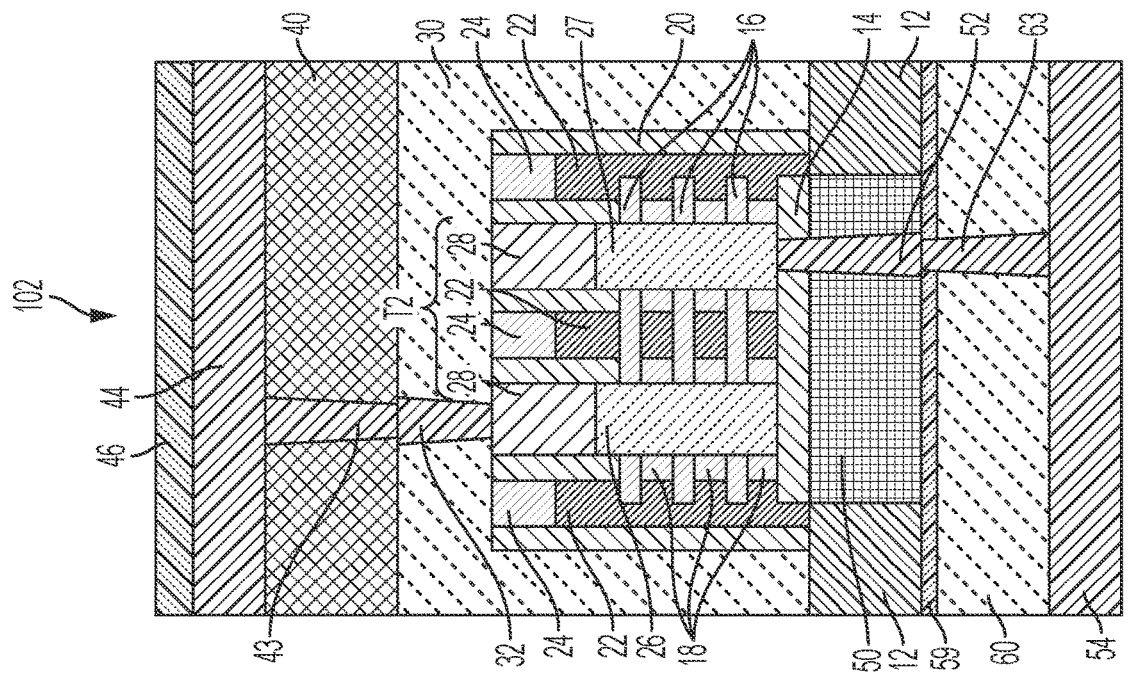
FIGS. 10A-10B are cross sectional views of the exemplary structures shown in FIGS. 9A-9B, respectively, after further backside processing including forming a ReRAM in the memory device region, and forming a backside BEOL structure.
Figure 10B:
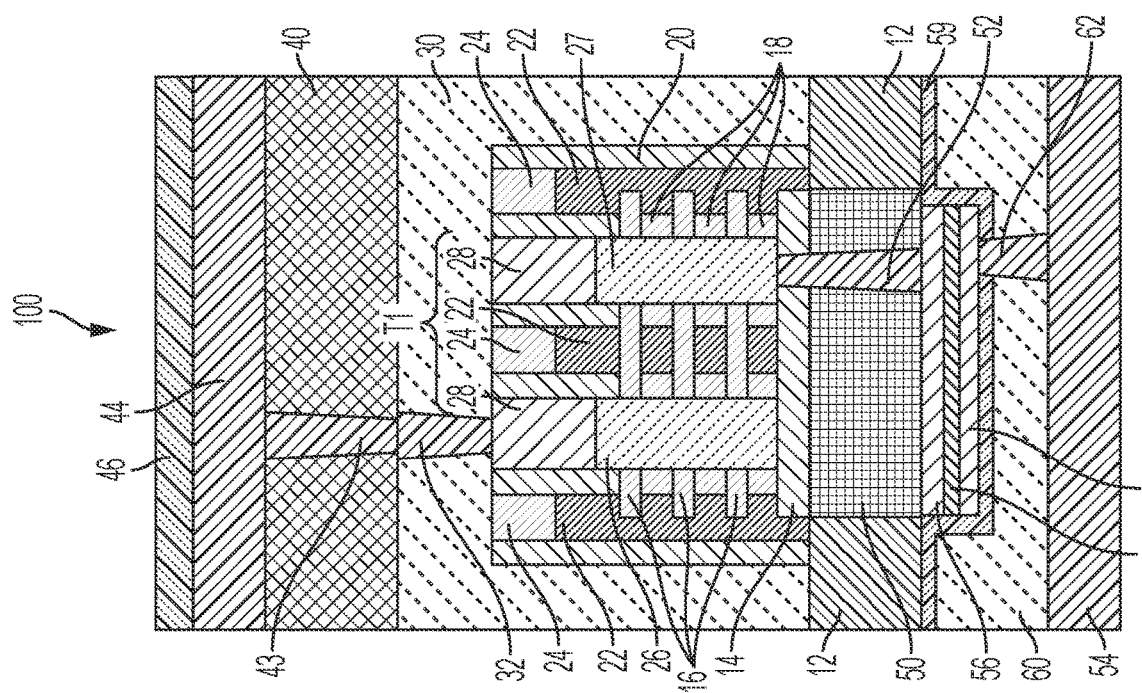

Referring now to FIGS. 10A-10B, there are illustrated the exemplary structures shown in FIGS. 9A-9B, respectively, after further backside processing including forming a ReRAM 56/57/58 in the memory device region 100, and forming a backside BEOL structure 54. ReRAM 56/57/58 is a backside ReRAM that includes a first electrode 56, a filament forming layer 57 and a second electrode 58. First electrode 56 includes a conductive material as mentioned above for the first electrode 34 of the frontside ReRAM, filament forming layer 57 includes a dielectric material as mentioned above for the filament forming layer 35 of the frontside ReRAM, and second electrode 58 includes a conductive material as mentioned above for the second electrode 36 of the frontside ReRAM. This backside ReRAM 56/57/58 can be formed by deposition of the various material layers followed by lithographic patterning of these various deposited material layers; these processing steps can be used to form the frontside ReRAM illustrated in FIG. 1A. As is illustrated in FIG. 10A, the backside ReRAM 56/57/58 has a surface that is in direct physical contact with the backside contact structure 52 that was formed in contact with the drain region 27 of the transistor, T1, that is present in the memory device region 100.

After forming the backside ReRAM 56/57/58, dielectric material layer 59 is formed. Dielectric material layer 59 includes a dielectric material as mentioned above for dielectric material layer 38. Dielectric material layer 59 encapsulates the backside ReRAM 56/57/58; i.e., it is present on physically exposed surfaces of the backside ReRAM 56/57/58.

Second backside dielectric material layer 60 is then formed on the dielectric material layer 59. Second backside dielectric material layer 60 embeds the backside ReRAM 56/57/58. The second backside dielectric material layer 60 includes a dielectric material as mentioned above for the first frontside interlayer dielectric material layer 30, and the second backside dielectric material layer 60 can be formed by a deposition process such, as for example, CVD, PECVD or spin-on coating.

Backside BEOL-to-ReRAM metal via 62 is then formed in the memory device region 100 and backside metal via 63 is formed in the logic device region 102. The backside BEOL-to-ReRAM metal via 62 and the backside metal via 63 are composed of at least a contact conductor material, as mentioned above for the frontside source/drain contact structures 28. These via structures can also include a diffusion barrier material as defined above present along a sidewall and a bottom wall of each of the via structures. The backside BEOL-to-ReRAM metal via 62 and the backside metal via 63 can be formed by a metallization process, as defined above. As is illustrated, the backside BEOL-to-ReRAM metal via 62 passes through the dielectric material layer 59 and contacts second electrode 58 of the backside ReRAM 56/57/58.

The backside BEOL structure 54 includes materials as mentioned above for the frontside BEOL structure 44. The backside BEOL structure 54 can be formed utilizing any interconnect device process including, for example, a damascene process. As is illustrated, the backside contact structure 52 in the memory device region 100 electrically connects the drain region 27 of transistor, T1, to the backside ReRAM 56/57/58, and the backside BEOL-to-ReRAM metal via 62 electrically connects the backside ReRAM 56/57/58 to the backside BEOL structure 54, and the backside contact structure 52 and the backside metal via 63 in the logic device region 102 electrically connect the drain region 27 of transistor, T2, to the backside BEOL structure 54.

Notably, FIG. 10A illustrates a semiconductor structure in accordance with another embodiment that includes transistor, T1, located in memory device region 100. Transistor, T1, includes including gate structure 22, source region 26 located on a first side of the gate structure 22, and drain region 27 located on a second side of the gate structure 22, wherein the second side of the gate structure 22 is opposite the first side of the gate structure 22. The structure of this embodiment further includes a ReRAM 56/57/58 located in the memory device region 100 and positioned beneath transistor, T1. The structure even further includes frontside contact structure 32 electrically connecting the source region 26 of transistor, T1, to frontside BEOL structure 44, and backside contact structure 52 electrically connecting the drain region 27 of transistor, T1, to the ReRAM 56/57/58. This backside ReRAM 56/57/58 is electrically connected to backside BEOL structure 54 by backside BEOL-to-ReRAM metal via 62. In the structure illustrated in FIG. 10A, the backside ReRAM 56/57/58 switching area is effectively increased without increasing the gate pitch. In other words, the ReRAM lateral width can be larger than 1 gate pitch. As this in an embedded memory application, there is wiring benefit for the structure (see, FIG. 10B) that is present in the logic device region 102. In this embodiment of the present application, there is no need to shift the gate contact (not shown) as would be the case for the embodiment illustrated in FIG. 5A.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a transistor located in a memory device region and comprising a gate structure, a source region located on a first side of the gate structure, and a drain region located on a second side of the gate structure, wherein the second side of the gate structure is opposite the first side of the gate structure;
   a resistive random access memory (ReRAM) located in the memory device region and positioned above the transistor;
   a frontside contact structure electrically connecting the ReRAM to the source region of the transistor; and
   a backside contact structure electrically connecting the drain region of the transistor to a backside back-end-of-the-line (BEOL) structure.

2. The semiconductor structure of claim 1, wherein the transistor is a nanosheet transistor comprising a plurality of vertically stacked and spaced apart semiconductor channel material nanosheets, and wherein the gate structure of the transistor wraps around a middle portion of each semiconductor channel material nanosheet of the plurality of vertically stacked and spaced apart semiconductor channel material nanosheets.

3. The semiconductor structure of claim 2, further comprising a bottom dielectric isolation layer and a backside interlayer dielectric material layer located beneath the nanosheet transistor, wherein the backside contact structure passes through both the backside interlayer dielectric material layer and the bottom dielectric isolation layer and is in direct physical contact with the drain region of the transistor.

4. The semiconductor structure of claim 1, further comprising a source/drain contact structure positioned between the frontside contact structure and the source region of the transistor, wherein the frontside contact structure is in direct physical contact with a first surface of the source/drain contact structure, and a second surface of the source/drain contact structure opposite the first surface, is in direct physical contact with the source region of the transistor.

5. The semiconductor structure of claim 1, further comprising a frontside BEOL structure located above the ReRAM, wherein the frontside BEOL structure is electrically connected to a top electrode of the ReRAM by a frontside BEOL-to-ReRAM metal via.

6. The semiconductor structure of claim 5, wherein the frontside BEOL-to-ReRAM metal via passes through a dielectric material layer that is present on the ReRAM.

7. The semiconductor structure of claim 5, further comprising a carrier wafer located on a surface of the frontside BEOL structure.

8. The semiconductor structure of claim 1, wherein the ReRAM is embedded in a frontside interlayer dielectric material layer.

9. The semiconductor structure of claim 1, further comprising a logic device area located adjacent to the memory device region, wherein the logic device area comprises another transistor, the another transistor comprising another gate structure, another source region located on a first side of the another gate structure, and another drain region located on a second side of the another gate structure, wherein the second side of the another gate structure is opposite the first side of the another gate structure.

10. The semiconductor structure of claim 9, further comprising another frontside contact structure electrically connecting the another source region of the another transistor to a frontside BEOL structure, and another backside contact structure electrically connecting the another drain region of the another transistor to a backside BEOL structure.

11. A semiconductor structure comprising:
    a transistor located in a memory device region and comprising a gate structure, a source region located on a first side of the gate structure, and a drain region located on a second side of the gate structure, wherein the second side of the gate structure is opposite the first side of the gate structure;
    a resistive random access memory (ReRAM) located in the memory device region and positioned beneath the transistor;
    a frontside contact structure electrically connecting the source region of the transistor to a frontside back-end-of-the-line (BEOL) structure;
    a backside contact structure electrically connecting the drain region of the transistor to the ReRAM; and
    a backside BEOL structure located beneath the ReRAM, wherein the backside BEOL structure is electrically connected to a bottom electrode of the ReRAM by a backside BEOL-to-ReRAM metal via.

12. The semiconductor structure of claim 11, wherein the transistor is a nanosheet transistor comprising a plurality of vertically stacked and spaced apart semiconductor channel material nanosheets, and wherein the gate structure of the transistor wraps around a middle portion of each semiconductor channel material nanosheet of the plurality of vertically stacked and spaced apart semiconductor channel material nanosheets.

13. The semiconductor structure of claim 12, further comprising a bottom dielectric isolation layer and a backside interlayer dielectric material layer located beneath the nanosheet transistor, wherein the backside contact structure passes through both the backside interlayer dielectric material layer and the bottom dielectric isolation layer and is in direct physical contact with the drain region of the transistor.

14. The semiconductor structure of claim 11, further comprising a source/drain contact structure positioned between the frontside contact structure and the source region of the transistor, wherein the frontside contact structure is in direct physical contact with a first surface of the source/drain contact structure, and a second surface of the source/drain contact structure opposite the first surface, is in direct physical contact with the source region of the transistor.

15. The semiconductor structure of claim 11, further comprising a frontside metal via positioned between the frontside contact structure and the frontside BEOL structure, wherein the frontside metal via has a first surface directly contacting the frontside BEOL structure, and a second surface, that is opposite the first surface, directly contacting frontside contact structure.

16. The semiconductor structure of claim 11, further comprising a carrier wafer located on a surface of the frontside BEOL structure.

17. The semiconductor structure of claim 11, wherein the ReRAM is embedded in a backside interlayer dielectric material layer.

18. The semiconductor structure of claim 11, further comprising a logic device area located adjacent to the memory device region, wherein the logic device area comprises another transistor, the another transistor comprising another gate structure, another source region located on a first side of the another gate structure, and another drain region located on a second side of the another gate structure, wherein the second side of the another gate structure is opposite the first side of the another gate structure.

19. The semiconductor structure of claim 18, further comprising another frontside contact structure electrically connecting the another source region of the another transistor to a frontside BEOL structure, and another backside contact structure electrically connecting the another drain region of the another transistor to a backside BEOL structure.

* * * * *